United States Patent [19]

Maas

[11] Patent Number: 4,949,398
[45] Date of Patent: Aug. 14, 1990

[54] GAAS MESFET BALANCED RESISTIVE MIXER

[75] Inventor: Stephen A. Maas, Long Beach, Calif.

[73] Assignee: The Aerospace Corporation, El Segundo, Calif.

[21] Appl. No.: 204,334

[22] Filed: Jun. 9, 1988

[51] Int. Cl.$^5$ .............................................. H04B 1/26
[52] U.S. Cl. ..................................... 455/326; 455/327
[58] Field of Search ................ 455/323, 325, 326, 327, 455/330, 333, 295, 296, 254, 255; 333/124, 125, 26, 177, 178; 332/43 B

[56] References Cited

U.S. PATENT DOCUMENTS

| | | |
|---|---|---|
| 4,193,048 | 3/1980 | Nyhus .................................. 455/326 |
| 4,377,005 | 3/1983 | Marchand et al. ................... 455/327 |
| 4,603,436 | 7/1986 | Butler ................................... 455/326 |
| 4,658,440 | 4/1987 | Davio et al. ......................... 455/327 |
| 4,739,519 | 4/1988 | Findley ................................ 455/327 |
| 4,751,744 | 6/1988 | Davio, Jr. ............................ 455/326 |

Primary Examiner—Robert L. Griffin
Assistant Examiner—Curtis Kuntz
Attorney, Agent, or Firm—William J. Burke

[57] ABSTRACT

A simple balanced-mixer circuit that uses the resistive channel of a GaAs MESFET exhibits superior intermodulation performance, with other performance parameters, e.g., conversion loss, port impedances, and LO sensitivity, being equal to or better than other diode mixers.

1 Claim, 3 Drawing Sheets

GAAS MESFET BALANCED RESISTIVE MIXER
STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

The field of this invention relates to devices which shift signals from one frequency to another. In particular, this mixer operates with frequencies in the microwave region.

2. Description of the Prior Art

In virtually all communications systems it is necessary at some point to shift a signal, without distortion, from one frequency to another frequency. The component used to perform this frequency shifting operation is called a mixer. Virtually all microwave mixers are realized as one of two fundamental types: (1) a passive Schottky-barrier diode mixer, or (2) an active MESFET mixer. In the Schottky-barrier diode mixer; a signal called the local oscillator (LO), is applied along with the input signal, the RF, to a Schottky-barrier diode. Because of the nonlinear current/voltage characteristic of the diode, a third frequency, the IF, is generated at a frequency equal to the difference between the RF and LO frequencies, but is otherwise identical to the RF signal. Thus, this "mixing" operation between the RF and LO in effect shifts the RF to the IF frequency.

In the active MESFET mixer, the nonlinear transfer characteristic between the gate voltage and the drain current of a GaAs MESFET (Metal Epitaxial Field Effect Transistor) is used to achieve the same mixing operation. The RF and LO signals are applied to the gate of the MESFET, and the drain current includes the IF signal. The advantage of an active MESFET mixer over a diode mixer is that it can amplify the RF input signal as well as shift its frequency; it is, however, a more expensive component because the GaAs MESFET is generally more expensive than a Schottky-barrier diode.

A property common to both the active MESFET and Schottky-barrier diode mixers is that they make use of the nonlinearities in solid-state devices in order to achieve frequency mixing. However, those same nonlinearities create intermodulation distortion, and give rise to spurious responses, a closely related phenomenon. Thus, there is a fundamental conflict between efficient mixing and distortion in these mixers: strong nonlinearities are essential in order to obtain efficient mixing, but those same nonlinearities also generate high levels of distortion.

Several methods have been employed to reduce intermodulation distortion in mixers. The most common is to use a balanced configuration, which partially rejects certain intermodulation products. However, a balanced mixer has several shortcomings: (1) the balanced configuration does not even partially reject the most serious manifestations of intermodulation distortion (the so-called third-order intermodulation products); (2) the use of a balanced configuration increases the required LO power by a factor of two to eight; and (3) active MESFET mixers are not easily realized in balanced configurations.

The only other effective method for reducing intermodulation distortion is to use very high LO power levels. However, these power levels are difficult and often expensive to achieve in high-frequency mixers, especially if they are balanced. Also, only a limited amount of LO power can be applied without damaging the diodes or MESFETs in the mixer.

It is therefore an object of the present invention to provide a mixer that exhibits superior intermodulation performance at reasonable LO power levels without the reduction of other performance parameters.

SUMMARY OF THE INVENTION

This invention achieves efficient frequency mixing in a component that has intermodulation distortion levels far lower than those of either diode or active MESFET mixers by using the resistive channel of a GaAs MESFET to approximate a time-varying linear resistor. In the GaAs MESFET resistive mixer, the LO is applied to the gate and the RF is applied to the drain. The gate is biased near its pinchoff voltage, but the drain has no dc bias applied to it. Consequently, the MESFET operates in its linear, or voltage-controlled resistor region, so the MESFET's channel operates as a passive frequency; thus, the MESFET's channel performs resistive mixing. When the MESFET is operated in this way, the nonlinearities of the channel resistance, although not zero, are very weak, so the level of intermodulation distortion is very low. To further reduce intermodulation levels, the mixer has been realized in a balanced configuration.

DETAILED DESCRIPTION OF THE PREFERRED EMBODIMENT

Figure 1:
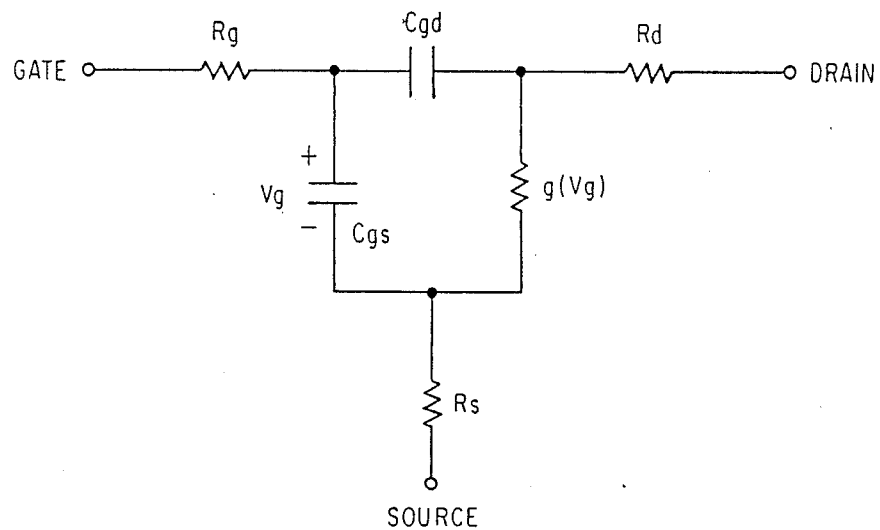
FIG. 1 is a schematic of an equivalent circuit of a GaAs MESFET with no bias applied to the drain.

FIG. 1 shows the equivalent circuit of the MESFET with zero-voltage dc drain bias. The channel conductance $g(V)_g$ is a weakly nonlinear conductance and is primarily responsible for the circuit's resistive mixing. This conductance is controlled by the internal gate-/source voltage $V_g$, which consists of a dc bias component and an LO-frequency voltage. Thus, $g(V_g) \approx g(t)$ and varies with time at the LO frequency. The resistances $R_g$, $R_s$, and $R_d$ are the gate, source, and drain parasitic resistances, and are approximately the same as those in the biased device. When the drain bias is zero, the MESFET's gate/channel capacitance is divided approximately equally between $C_{gs}$ and $C_{gd}$.

The RF signal is applied to the MESFET's drain terminal, and the LO is applied to the gate. Resistive mixing in the channel conductance $g(V_g)$ causes IF currents to be generated in $g(V_g)$, and these currents are filtered from the RF currents and applied to the IF output port. Because the conductance $G(V_g)$ is weakly nonlinear, the intermodulation currents generated in $g(V_g)$ are very small, so the level of the mixer's intermodulation distortion is very low.

Because the dc drain voltage is zero, the drain/gate capacitance $C_{gd}$ is much greater than it would be in a biased MESFET. This large value of $C_{gd}$ is a potential problem in designing a mixer: first, because it reduces RF/LO isolation; and second, because LO voltage coupled to the drain or RF voltage coupled to the gate may increase intermodulation distortion. Therefore, in order to minimize distortion, the LO voltages are short-circuited at the drain and the RF voltages are short-circuited at the gate. These short circuits can be realized by either filters or a balanced structure.

Figure 2:
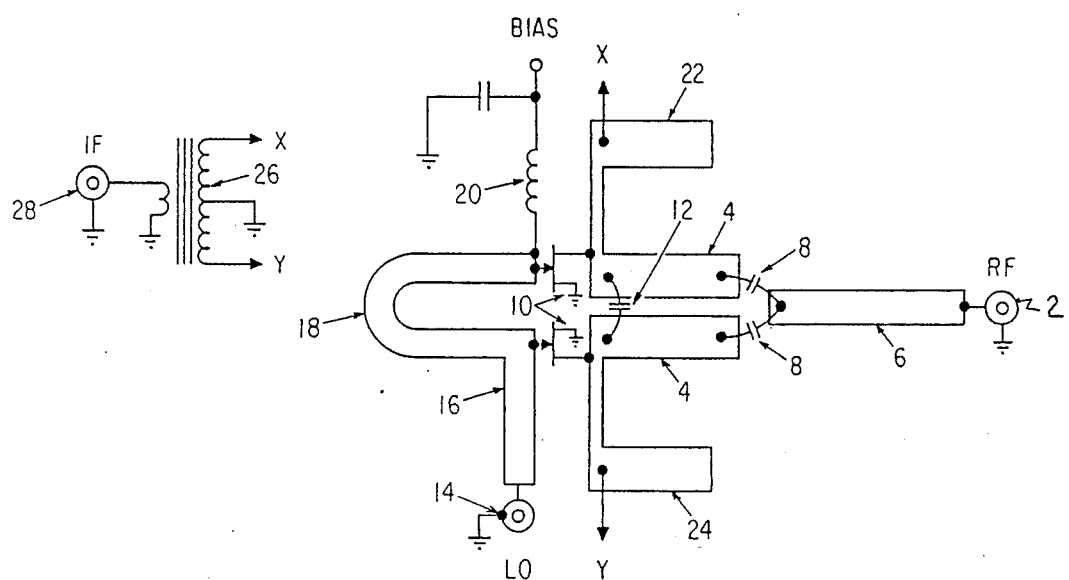
FIG. 2 is a schematic of a balanced mixer circuit.

FIG. 2 shows the preferred embodiment of the invention. The RF input port 2 is connected to the input of the RF transformer 4 via a short length of microstrip transmission line 6 and two capacitors 8. The RF transformer is approximately one-quarter wavelength long, and its output is connected to the drain terminals of two FETs 10. The purpose of this RF transformer 4 is to match the RF impedance of the FETs' channels to the 50-ohm RF source impedance. In order to prevent short-circuiting the IF currents in the FETs' channels, which have a 180 degree phase difference, the transformer is split longitudinally. A small-value capacitor 12 (5.1 pF) connects the FETs' drains at the RF and LO frequencies, without short-circuiting the IF.

The LO input port 14 is connected via a short length of 50-ohm microstrip transmission line 16 to the LO balun 18. The LO balun consists of a half-wavelength of 50-ohm microstrip transmission line, the ends of which are connected to the gates of the FETs 10. This balun causes the LO voltages at the gates to have a 180 degree phase difference, and thus the channel conductances will vary 180 degrees out of phase. Also, because of the 180 degree LO phase difference, the LO leakage through the gate/drain capacitances in FIG. 1) of the FETs has a 180 degree phase difference. Thus, the capacitor 12 causes the drain terminals of the FETs to be virtual grounds (short circuits) for LO leakage, as required to minirize intermodulation distortion. The RF leakage through $C_{gd}$ is in phase at the FETs' gates; however, a well-known property of the LO balun is that it presents a short circuit to in-phase inputs. Thus, it short-circuits the RF voltages, as required, at the FETs' gates.

Also shown in FIG. 2 is a simple L-C bias circuit 20 used to apply dc bias to the gates of the FETs, and simple IF filters 22 and 24 consisting of a high-impedance, 90-degree microstrip line and a 90 degree open-circuit stub, are used to separate the IF currents. The outputs of the IF filters are connected to the inputs of an IF hybrid coupler 26; in this circuit the IF hybrid is realized by means of a center-tapped transformer 26 (Mini-Circuits Co. type T4-1) having a turns ratio of 2:1. The output of the hybrid is connected directly to the IF port 28. The bias and IF circuits are conventional and can be realized in a variety of ways.

Figure 3:
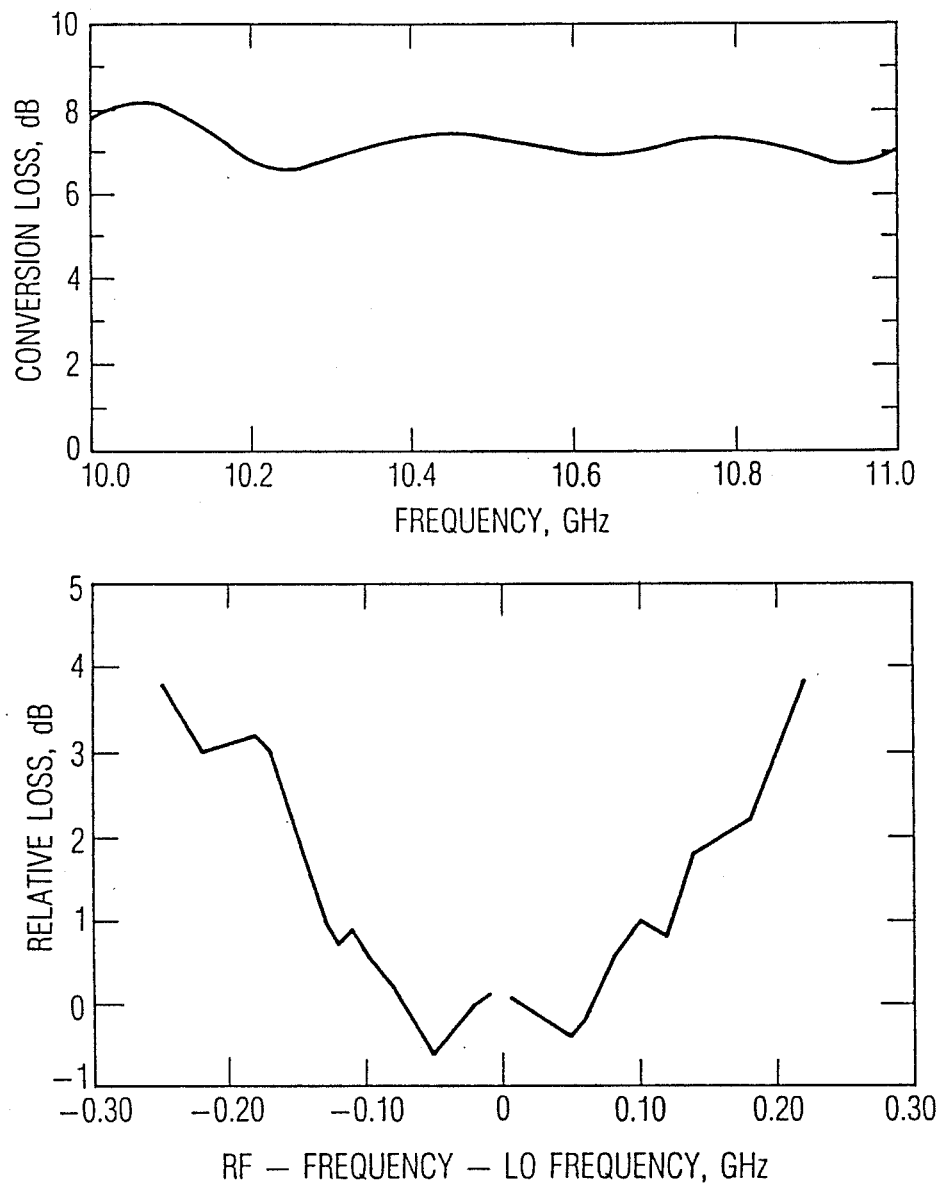
FIG. 3A is a graph of a Mixer Passband with a fixed IF frequency.
FIG. 3B is a Mixer Passband with a fixed LO frequency.
Figure 4:
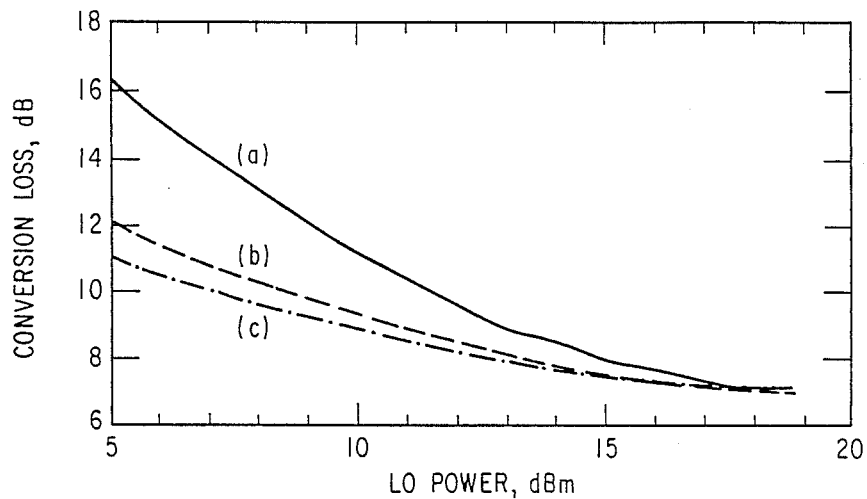
FIG. 4 is a graph showing conversion loss as a function of LO power and gate bias.
Figure 5:
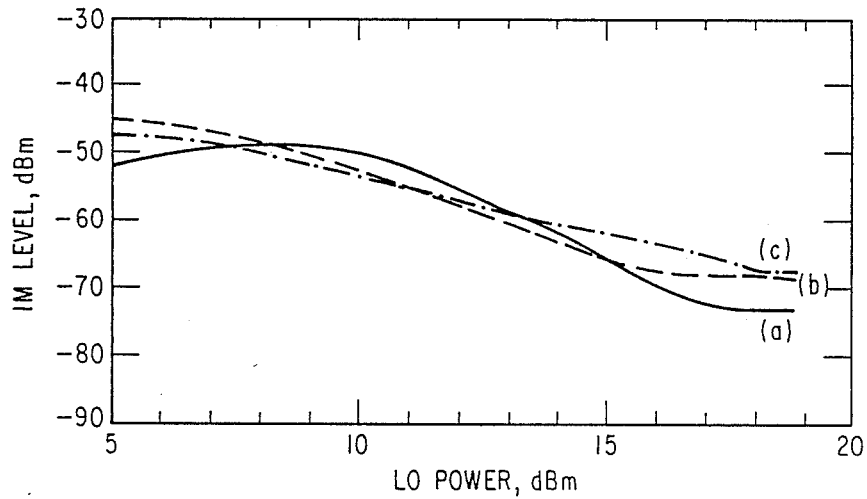
FIG. 5 is a graph showing third-order IM Level as a function of LO power and gate bias, when the RF input level is −3.0 dBM.
Figure 6:
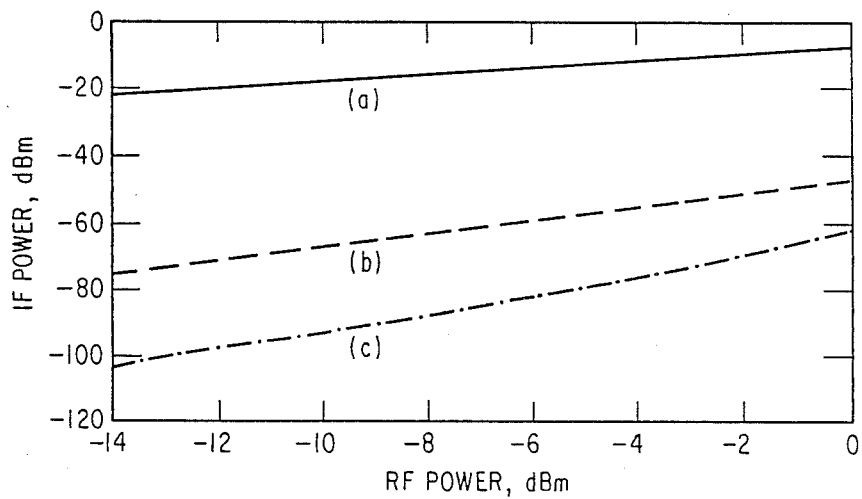
FIG. 6 is a graph showing linear, second-order, and third-order IM levels versus RF level at an LO level of 18 dBm.

This embodiment of the invention was designed to operate at an RF frequency of approximately 10 GHz with an IF of 10 to 300 MHz. FIG. 3a shows the conversion loss as a function of RF frequency with the IF fixed at 60 MHz, and FIG. 3b shows the relative conversion loss as a function of IF frequency with the LO frequency fixed at 10.5 GHz. The conversion loss is comparable to that of a diode mixer. FIG. 4 shows the conversion loss as a function of LO power and gate dc bias voltage, indicating that good conversion efficiency can be achieved with moderate LO power levels. FIG. 5 shows the IF output power of the third-order intermodulation distortion components when the RF input power is −dBm; this figure shows that very low distortion levels can be achieved with moderate LO power levels. FIG. 6 shows the output levels of the linear, second-order, and third-order IF output levels as a function of RF input power level, when the LO power level is 18 dBm and the gate dc bias voltage is −1.10 V.

Other embodiments of the invention are possible; the common property of all such embodiments is that the LO is applied to the gate, the RF is applied to the drain, and the FET's channel operates as a resistive mixer. One possible embodiment is a single-ended mixer in which only one MESFET is used. In this case the gate and drain RF and LO short circuits are realized by filters; the RF and LO frequencies must be separated enough to allow effective filtering, so the IF must be relatively high (approximately 1 GHz for a 10-GHz RF frequency). The invention is applicable at frequencies throughout the RF, microwave, and millimeter-wave range.

I claim:

1. A balanced mixer circuit having improved intermodulation properties of the circuit comprising:
   a. two field effect transistors (FET) having sources, gates and drains with the sources connected to a ground;
   b. a capacitor connected between the drains of the FETs;
   c. a LO balun transformer having a length of one-half wavelength at the LO frequency with the ends connected to a gate in each of the FETs;
   d. an RF transformer having a longitudinal split and a length of approximately one-quarter wavelength at the RF frequency with the ends connected to the drain of the FETs;
   e. an IF hybrid consisting of two IF filters and a RF transformer said RF transformer having a center-tapped primary terminal and a secondary terminal and a 2:1 primary-to-secondary turns ratio with the primary terminal connected to the output terminals of the IF filters and the secondary terminal connected to the IF output port;
   f. said two IF filters each consisting of a transmission line and an open-circuit stub, where one end of each transmission line is connected to the drain of one FET and the other end of the transmission line is connected to one terminal of the IF hybrid's primary;
   g. whereby after LO and dc bias are applied to the gates of the FET and an RF is applied to the drain, the output at the secondary terminal of the IF hybrid is an IF signal with a frequency equal to the difference between the LO and RF frequencies.

* * * * *